United States Patent
Tahmasebi et al.

(10) Patent No.: US 10,446,205 B1
(45) Date of Patent: Oct. 15, 2019

(54) MAGNETIC RANDOM ACCESS MEMORY STRUCTURES, INTEGRATED CIRCUITS, AND METHODS FOR FABRICATING THE SAME

(71) Applicant: Globalfoundries Singapore Pte. Ltd., Singapore (SG)

(72) Inventors: Taiebeh Tahmasebi, Singapore (SG); Dimitri Houssameddine, Singapore (SG); Michael Nicolas Albert Tran, Singapore (SG); Chenchen Jacob Wang, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/938,770

(22) Filed: Mar. 28, 2018

(51) Int. Cl.
| | |
|---|---|
| *G11C 11/00* | (2006.01) |
| *G11C 11/16* | (2006.01) |
| *B82Y 25/00* | (2011.01) |
| *H01L 43/02* | (2006.01) |
| *H01L 43/08* | (2006.01) |
| *H01L 43/10* | (2006.01) |
| *H01L 43/12* | (2006.01) |
| *H01L 27/22* | (2006.01) |

(52) U.S. Cl.
CPC ............ *G11C 11/161* (2013.01); *B82Y 25/00* (2013.01); *G11C 11/1655* (2013.01); *G11C 11/1657* (2013.01); *G11C 11/1659* (2013.01); *H01L 27/228* (2013.01); *H01L 43/02* (2013.01); *H01L 43/08* (2013.01); *H01L 43/10* (2013.01); *H01L 43/12* (2013.01)

(58) Field of Classification Search
CPC .............. G11C 11/161; G11C 11/1655; G11C 11/1657; G11C 11/1659; H01L 27/228; H01L 43/02
USPC ......................................... 365/158, 171, 173
See application file for complete search history.

(56) References Cited

U.S. PATENT DOCUMENTS

| | | | |
|---|---|---|---|
| 2015/0115379 | A1 | 4/2015 | Lim et al. |
| 2015/0255134 | A1 | 9/2015 | Uchida et al. |
| 2016/0276407 | A1* | 9/2016 | Naik ................ H01L 27/228 |
| 2017/0033278 | A1* | 2/2017 | Lapicki ............ H01L 43/08 |

* cited by examiner

*Primary Examiner* — Huan Hoang
(74) *Attorney, Agent, or Firm* — Thompson Hine LLP

(57) ABSTRACT

Spin transfer torque magnetic random access memory structures, integrated circuits, and methods for fabricating integrated circuits are provided. An exemplary spin transfer torque magnetic random access memory structure has a perpendicular magnetic orientation, and includes a bottom electrode, a seed layer over the bottom electrode, a hard layer over the seed layer, a magnetically continuous transition layer over the hard layer, a reference layer over the magnetically continuous transition layer, a tunnel barrier layer over the reference layer, a storage layer formed over the tunnel barrier layer, and a top electrode. The reference layer, the tunnel barrier layer, and the storage layer form a magnetic tunnel junction (MTJ) element with a perpendicular orientation.

20 Claims, 12 Drawing Sheets

MAGNETIC RANDOM ACCESS MEMORY STRUCTURES, INTEGRATED CIRCUITS, AND METHODS FOR FABRICATING THE SAME

TECHNICAL FIELD

The technical field generally relates to integrated circuits, and more particularly relates to integrated circuits with magnetic random access memory (MRAM) structures, such as spin transfer torque magnetic random access memory (STT-MRAM) structures.

BACKGROUND

A magnetic memory cell or device stores information by changing electrical resistance of a magnetic tunnel junction (MTJ) element. The MTJ element typically includes a thin insulating tunnel barrier layer sandwiched between a magnetically fixed layer and a magnetically free layer, forming a magnetic tunnel junction. Magnetic orientations of the fixed and free layers may be perpendicular to the growth direction, forming a perpendicular MTJ (or pMTJ) element. The pMTJ element could be formed of either a bottom pinned pMTJ element or a top pinned pMTJ element. The bottom pinned pMTJ element is formed by having the magnetically fixed layer disposed below the magnetically free layer while the top pinned pMTJ element is formed by having the fixed layer disposed above the free layer.

Spin transfer torque (STT) or spin transfer switching, uses spin-aligned ("polarized") electrons to directly apply a torque on the MTJ layers. Specifically, when electrons flowing into a layer have to change spin direction, a torque is developed and is transferred to the nearby layer.

In order to obtain strong perpendicular magnetic anisotropy (PMA) for the fixed layer, a well-ordered crystalline orientation of the fixed layer is required. Several conventional techniques have been proposed to improve PMA for the fixed layer. However, these conventional techniques undesirably lead to reduced thermal budget and thermal endurance of the pMTJ stack.

In view of the foregoing, it is desirable to provide a memory structure with improved PMA, enhanced thermal endurance and thermal budget, as well as higher tunneling magnetoresistance (TMR) signal. Furthermore, it is also desirable to provide a method for fabricating such memory structures that is cost effective and compatible with logic processing. Also, it is desirable to provide integrated circuits and methods for fabricating integrated circuits including such memory structures. Furthermore, other desirable features and characteristics will become apparent from the subsequent detailed description and the appended claims, taken in conjunction with the accompanying drawings and this background.

BRIEF SUMMARY

Spin transfer torque magnetic random access memory structures, integrated circuits, and methods for fabricating integrated circuits are provided. An exemplary spin transfer torque magnetic random access memory structure has a perpendicular magnetic orientation, and includes a bottom electrode, a seed layer over the bottom electrode, a hard layer over the seed layer, a magnetically continuous transition layer over the hard layer, a reference layer over the magnetically continuous transition layer, a tunnel barrier layer over the reference layer, a storage layer formed over the tunnel barrier layer, and a top electrode. The reference layer, the tunnel barrier layer, and the storage layer form a magnetic tunnel junction (MTJ) element with a perpendicular orientation.

In another exemplary embodiment, a spin transfer torque magnetic random access memory structure has a perpendicular magnetic orientation and includes a bottom electrode, a seed layer over the bottom electrode, an anti-parallel layer over the seed layer, a synthetic anti-ferromagnetic layer over the anti-parallel layer, a magnetic hard layer over the synthetic anti-ferromagnetic layer, wherein the magnetic hard layer has a thickness of from about 6 A to about 35 A, a tunnel barrier layer over the magnetic hard layer, a storage layer formed over the tunnel barrier layer, and a top electrode. The magnetic hard layer, the tunnel barrier layer, and the storage layer form a magnetic tunnel junction (MTJ) element with a perpendicular orientation.

In yet another exemplary embodiment, a method for fabricating an integrated circuit is provided. The method includes forming a bottom electrode, forming a seed layer over the bottom electrode, forming a synthetic anti-ferromagnetic layer over the seed layer, and forming a magnetic layer over the synthetic anti-ferromagnetic layer. The magnetic layer is a magnetically continuous transition layer or a magnetic hard layer. The magnetically continuous transition layer is an alloy or the magnetically continuous transition layer includes a magnetic sublayer and a non-magnetic sublayer. The magnetic hard layer is a single magnetic layer or a composite structure of magnetic and non-magnetic sublayers. The method further includes forming a tunnel barrier layer over the magnetic layer, forming a storage layer over the tunnel barrier layer, and forming a top electrode over the storage layer.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
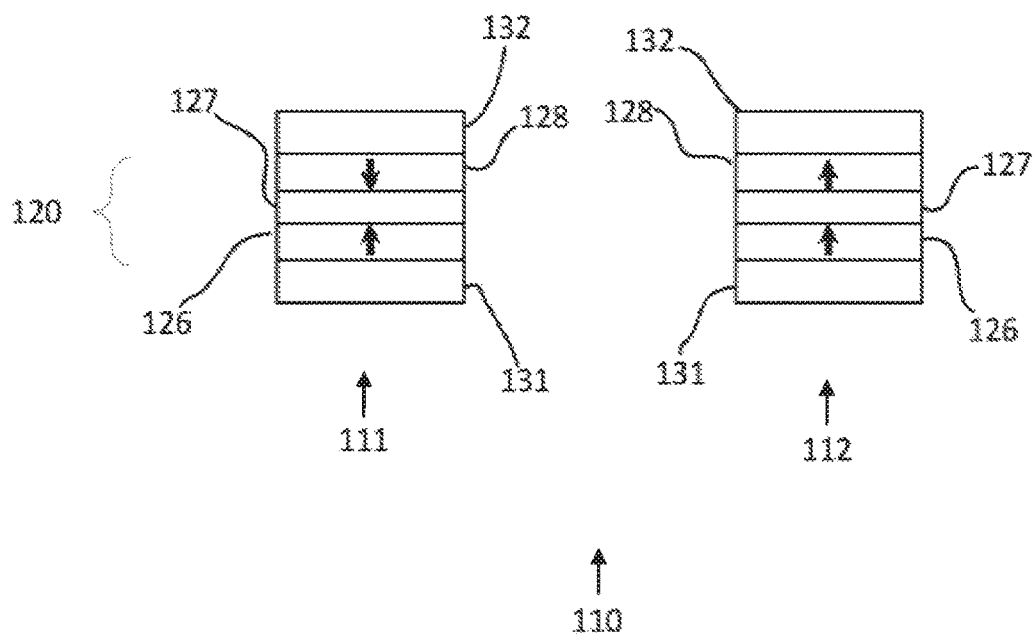
FIG. 1 illustrates simplified diagrams of parallel state and anti-parallel state of a bottom pinned perpendicular MTJ element of a magnetic memory cell.

The following detailed description is merely exemplary in nature and is not intended to limit the integrated circuits with magnetic random access memory structures or methods for fabricating integrated circuits with magnetic random access memory structures. Furthermore, there is no intention to be bound by any expressed or implied theory presented in the preceding technical field, background or brief summary, or in the following detailed description.

For the sake of brevity, conventional techniques related to conventional device fabrication may not be described in detail herein. Moreover, the various tasks and processes described herein may be incorporated into a more comprehensive procedure or process having additional functionality not described in detail herein. In particular, various techniques in semiconductor fabrication processes are well-known and so, in the interest of brevity, many conventional techniques will only be mentioned briefly herein or will be omitted entirely without providing the well-known process details. Further, it is noted that integrated circuits include a varying number of components and that single components shown in the illustrations may be representative of multiple components.

The drawings are semi-diagrammatic and not to scale and, particularly, some of the dimensions are for the clarity of presentation and are shown exaggerated in the drawings. Similarly, although the views in the drawings for ease of description generally show similar orientations, this depiction in the drawings is arbitrary. Generally, the integrated circuit can be operated in any orientation. Further, spatially relative terms, such as "upper", "over", "lower", "under" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

As used herein, it will be understood that when a first element or layer is referred to as being "over" or "under" a second element or layer, the first element or layer may be directly on the second element or layer, or intervening elements or layers may be present. When a first element or layer is referred to as being "on" a second element or layer, the first element or layer is directly on and in contact with the second element or layer. As used herein, a "material layer" is a layer that includes at least 60 wt. % of the identified material. For example, a copper layer is a layer that is at least 60 wt. % copper. Likewise, a layer that is a "material" includes at least 60 wt. % of the identified material. For example, a layer that is copper is a layer that is at least 60 wt. % copper.

Embodiments of the present disclosure generally relate to memory cells or devices. In one embodiment, the memory cells are magnetoresistive memory cells such as spin transfer torque magnetoresistive random access memory (STT-MRAM) devices. An exemplary magnetoresistive memory cell includes a perpendicular magnetic tunnel junction (pMTJ) storage unit. In a specific magnetic tunnel junction of pMTJ stack, the interface quality (or smoothness) is known as one of the key factors providing the high perpendicular magnetic anisotropy (PMA). The interface quality not only has a direct impact on the PMA of the magnetic layers, it also has a negative impact on tunnel barrier interface, and hence, time dependent dielectric breakdown (TDDB) when the roughness value is high.

An exemplary MTJ storage unit includes a base layer, including a seed layer and, optionally, a wetting layer, that provides an improved PMA of the fixed layer of the pMTJ stack and further enhances the thermal endurance and thermal budget of the pMTJ stack. Other suitable types of memory cells may also be useful and may be incorporated into standalone memory devices including, but not limited to, USB or other types of portable storage units, or integrated circuits (ICs), such as microcontrollers or system on chips (SoCs). The devices or integrated circuits may be incorporated into or used with, for example, consumer electronic products, or relate to other types of devices.

FIG. 1 shows a simplified cross-sectional view of an embodiment of a bottom pinned perpendicular MTJ (pMTJ) unit 110 of a magnetic memory cell in a programmed state 111 and in a programmed state 112. The MTJ unit 110 includes a pMTJ element or stack 120 disposed between a bottom electrode 131 and a top electrode 132. The bottom electrode 131 is proximate to the substrate (not shown) on which the memory cell is formed while the top electrode 132 is distal from the substrate.

The exemplary pMTJ stack 120 includes a magnetically fixed (pinned) layer or polarizer layer 126, a tunnel barrier layer 127, and a magnetically free layer or storage layer 128. In the illustrated embodiment, the magnetically fixed layer 126 is disposed below the magnetically free layer 128, forming a bottom pinned pMTJ stack 120. The magnetic orientation of fixed layer 126 is fixed in a first perpendicular direction. The term perpendicular direction refers to the direction that is perpendicular to the surface of a substrate or perpendicular to the plane of the layers of the pMTJ stack 120. As shown, the first perpendicular direction is in an upward direction away from the substrate. Providing the first perpendicular direction in a downward direction towards the substrate may also be useful in alternative embodiments. The magnetic orientation of free layer 128 may be programmed to be in a first or same direction as fixed layer 126 or in a second or opposite direction as fixed layer 126.

For example, as shown by programmed state 111, the magnetic direction of free layer 128 is programmed to be in the second or anti-parallel direction to fixed layer 126. The corresponding MTJ electrical resistance between free layer 128 and fixed layer 126 in anti-parallel arrangement is denoted as $R_{AP}$. In programmed state 112, the magnetization of free layer 128 is programmed to be in the first or parallel direction to fixed layer 126. The corresponding MTJ electrical resistance between free layer 128 and fixed layer 126 in parallel arrangement is denoted as $R_P$. The resistance $R_{AP}$ is higher than the resistance $R_P$.

Figure 2:
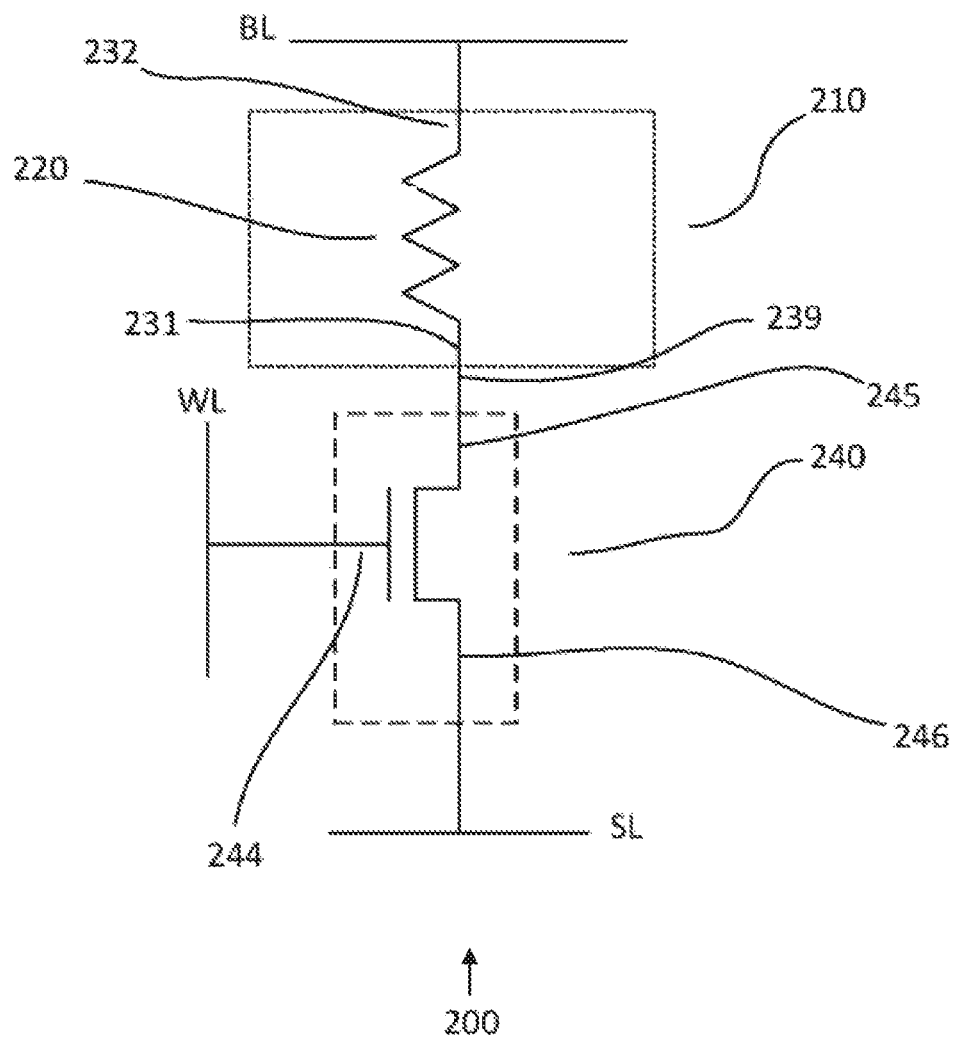
FIG. 2 is a schematic diagram of an embodiment of a magnetic memory cell.

FIG. 2 is a schematic diagram of an embodiment of an exemplary memory cell 200. The memory cell 200 is a non-volatile memory cell, for example, a magnetoresistive memory cell, such as a spin transfer torque-magnetoresistive random access memory (STT-MRAM) cell. Other suitable types of memory cells may also be useful. As shown, the memory cell 200 includes a magnetic storage unit 210 and a cell selector unit 240. The magnetic storage unit 210 is coupled to the cell selector unit 240 at a first cell node 239 of the memory cell 200. The exemplary magnetic storage unit 210 includes a pMTJ element 220. The pMTJ element 220 may be similar to that described in FIG. 1. Other suitable types of MTJ elements may also be useful.

The exemplary pMTJ element 220 includes a first electrode 231 and a second electrode 232. The first electrode 231, for example, may be a bottom electrode while the second electrode 232 may be a top electrode. Other configurations of electrodes may also be useful. In one embodiment, the top electrode 232 is electrically connected to a bit line (BL) and the bottom electrode 231 is electrically connected to the first cell node 239.

In FIG. 2, the exemplary cell selector unit 240 is a select transistor for selecting the memory cell 200. In one embodiment, the cell selector unit 240 is a metal oxide semiconductor (MOS) transistor, such as an n-type MOS transistor, and includes a gate or control terminal 244, a first source/drain (S/D) terminal 245, and a second source/drain (S/D) terminal 246. The first S/D terminal 245 may be referred to as the drain and the second S/D terminal 246 may be referred to as the source. Exemplary S/D terminals 245 and 246 are heavily doped with first polarity type dopants, defining the first type transistor. For example, in the case of an n-type transistor, the S/D terminals 245 and 246 are n-type heavily doped regions and may have a dopant concentration of about $1E20/cm^3$ or greater. Other types of transistors or selectors may also be useful.

In an embodiment, the first S/D terminal 245 of the cell selector unit 240 and first electrode 231 of the magnetic storage unit 210 are commonly coupled at the first cell node 239, i.e., the drain terminal 245 of the cell selector unit 240 is coupled to the bottom electrode 231 of the magnetic storage unit 210. In such embodiment, the second or source terminal 246 of the cell selector unit 240 is coupled to a source line (SL) while the gate terminal 244 is coupled to a wordline WL.

Figure 3:
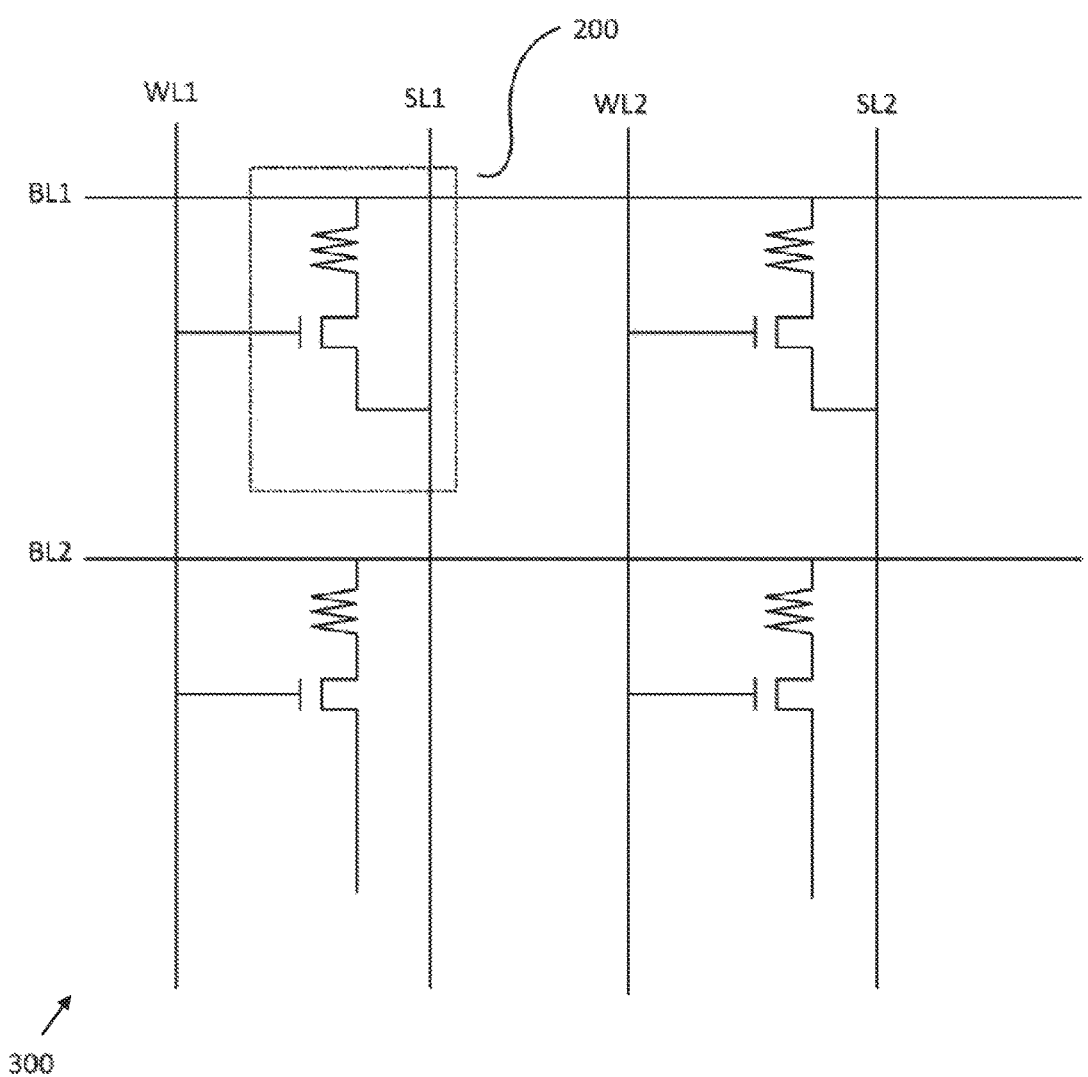
FIG. 3 illustrates shows an exemplary array of magnetic memory cells.

FIG. 3 shows a schematic diagram of an embodiment of a memory array 300 that includes a plurality of interconnected memory cells 200. The memory cells 200 may be similar to those described in FIG. 2. For example, the memory cells 200 may be MRAM cells, such as STT-MRAM cells. Common elements may not be described or described in detail. Other suitable types of memory cells may also be useful.

As shown, the memory array 300 includes four memory cells 200 arranged in a 2×2 array, i.e., the memory array 300 is arranged to form two rows and two columns of memory cells 200. Memory cells 200 of a row are interconnected by a wordline (WL1 or WL2) while memory cells 200 of a column are interconnected by a bitline (BL1 or BL2). The second S/D or source terminal of each memory cell 200 (as identified in FIG. 2) is coupled to a source line (SL1 or SL2). As shown, the source lines extend in the row or wordline direction. Other suitable cell configurations may also be useful. Although the memory array 300 is illustrated as a 2×2 array, it is understood that arrays of other sizes may also be useful.

Figure 4:
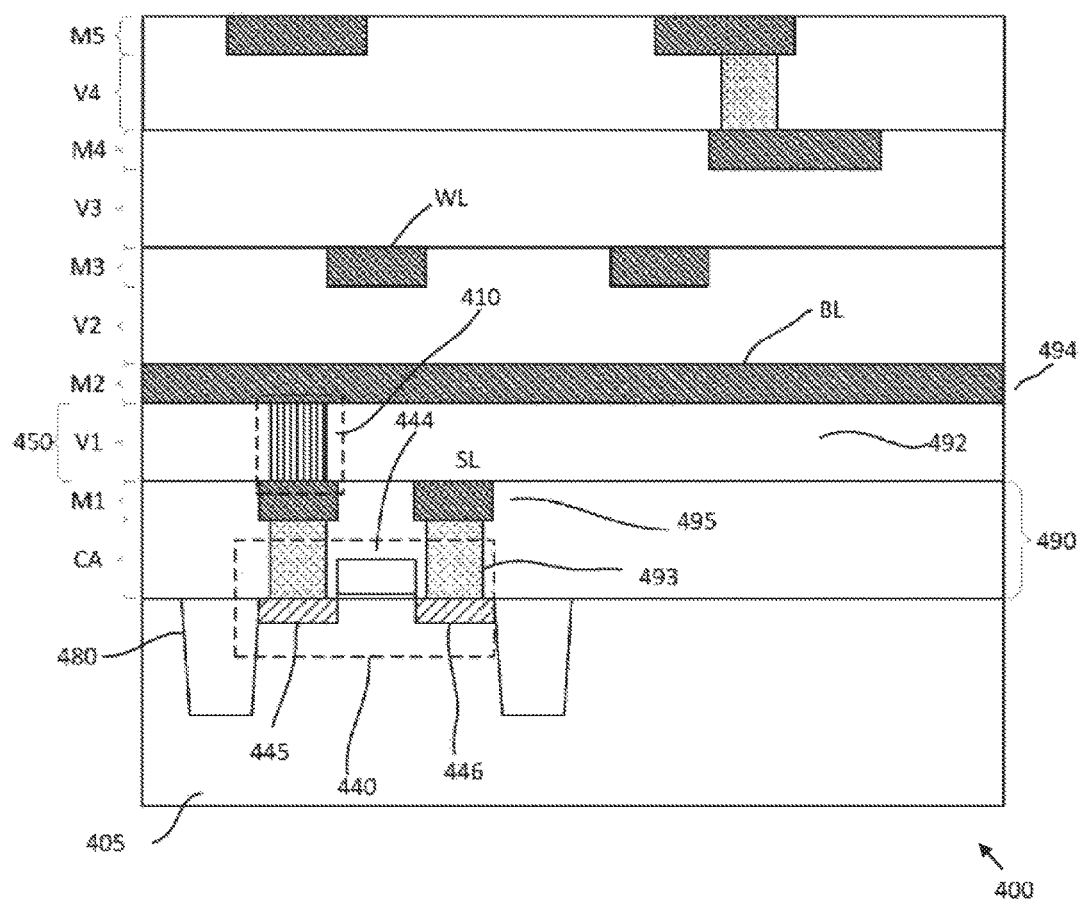
FIG. 4 is a cross-sectional view of an exemplary embodiment of a memory cell.

FIG. 4 shows a cross-sectional view of an exemplary embodiment of a memory cell 400 of a device. The cross-sectional view is taken along a second or bitline direction of the device. The memory cell 400 may be a NVM cell, for example a magnetoresistive NVM cell, such as a STT-MRAM cell. The memory cell 400 may be similar to that described in FIG. 2. Common elements may not be described or described in detail.

As shown, the memory cell 400 is disposed on a substrate 405. An exemplary substrate 405 is a semiconductor substrate, such as a silicon substrate. For example, the substrate 405 may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, is formed from silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

In an exemplary embodiment of FIG. 4, the memory cell 400 is disposed in a cell region of the substrate 405 that may be part of an array region. An exemplary array region may include a plurality of cell regions. The substrate 405 may include other types of device regions (not shown), such as high voltage (HV) device regions as well as logic regions, including low voltage (LV) and intermediate voltage (IV) device regions. Other types of regions may also be provided.

As shown, isolation regions 480 are formed in substrate 405. Exemplary isolation regions 480 serve to isolate different device regions in substrate 405. As shown, a cell region for a memory cell 400 is isolated by isolation regions 480. Isolation regions 480 may be provided to isolate columns of memory cells 400. Isolation regions 480 may be shallow trench isolation (STI) regions. Other configurations of isolation regions may also be useful.

In FIG. 4, the memory cell 400 includes a cell selector unit 440 and a storage unit 410. The cell selector unit 440 is formed in the cell region. The cell selector unit 440 includes a select transistor for selecting the memory cell 400. In one embodiment, the select transistor is a metal oxide semiconductor (MOS) transistor. The transistor, as shown, includes first and second source/drain (S/D) regions 445 and 446 formed in the substrate 405 and a gate 444 disposed on the substrate 405 between the S/D regions 445 and 446. The first S/D region 445 may be referred to as a drain region and the second S/D region 446 may be referred to as a source region. An exemplary gate 444 may be a gate conductor extending along a first or wordline direction. Such a gate conductor may form a common gate for a row of memory cells 400.

As shown, a dielectric layer 490 lies over the transistors and other components on the substrate 405. The dielectric layer may be silicon oxide. Dielectric layer 490 may serve as a premetal dielectric layer or first contact layer. Dielectric layer 490 may be referred to as CA level.

Interconnects connect various components of the integrated circuit to perform desired functions. Exemplary interconnects include contacts 493 and conductive or metal lines 495 that are formed through the ILD layer 490 to be coupled to a metal level 494. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. In some cases, the conductors and contacts may have different materials.

In FIG. 4, a dielectric layer covers the CA level dielectric layer and may serve as a first metal level M1 of the first ILD layer 490. The upper dielectric layer, for example, is a silicon oxide layer. Other types of dielectric layers may also be useful. Conductive lines 495 are formed in the M1 level dielectric layer. The first metal level M1 and CA may be referred to as within lower ILD level 490. Upper ILD layers or levels may include ILD level 2 to ILD level x. For example, in the case where x=5 (5 levels), the upper levels include ILD levels from 2 to 5, which include via levels V1 to V4 and metal levels M2 to M5. The number of ILD layers may depend on, for example, design requirements or the logic process involved. The upper ILD layers may be formed of silicon oxide. Other types of dielectric materials, such as low k, high k or a combination of dielectric materials may also be useful.

The uppermost ILD level (e.g., M5) may have different design rules, such as critical dimension (CD), than the lower ILD levels. For example, Mx may have a larger CD than metal levels M1 to Mx−1 below. For example, the uppermost metal level may have a CD that is two times or six times the CD of the metal levels below. Other configurations of the ILD levels may also be useful.

A dielectric liner (not shown) may be disposed between ILD levels and on the substrate 405 and may serve as an etch stop layer. The dielectric liner may be formed of a low k dielectric material, such as nBLOK. Other types of dielectric materials for the dielectric liner may also be useful.

As shown, S/D contacts 493 are disposed in the CA level. The S/D contacts 493 are coupled to the first and second S/D regions 445 and 446 of the select transistor. Other S/D contacts to other S/D regions of transistors may also be provided. The CA level may include a gate contact (not shown) coupled to the gate 444 of the select transistor. The gate contact may be disposed in another cross-section of the device. The contacts may be tungsten contacts. Other types of contacts may also be useful. Other S/D and gate contacts for other transistors may also be provided.

As described, conductive lines 495 are provided in M1. Conductive lines 495 are coupled to the S/D contacts 493. In one embodiment, a source line is coupled to the second S/D region 446 of the select transistor. The first S/D contact may be coupled to contact pad or island in M1. The contact pads provide connections to upper ILD levels. The conductive lines or contact pads may be formed of copper or copper alloy. Other types of conductive material may also be useful.

Exemplary upper ILD levels may include contacts in the via level and contact pads/metal lines in the metal level. The contacts and contact pads provide connection from M5 to the first S/D region 445 of the select transistor. A pad level (not shown) may be disposed over the uppermost ILD level for providing external electrical interconnections to the components. A dielectric liner may be disposed between the uppermost metal level and pad level. The dielectric liner, for example, serves as an etch stop layer during via etch process and may also serve as a diffusion barrier layer for, for example, copper (Cu) layer.

As shown in FIG. 4, the storage unit 410 of the memory cell 400 is disposed in a storage dielectric layer 450. The storage dielectric layer 450 may be a via level of an ILD level. As shown, the storage dielectric layer 450 is V1 of M2. Providing the storage dielectric layer 450 at other via levels may also be useful. In other embodiments, the storage dielectric layer 450 may be a dedicated storage dielectric layer and not part of an interconnect level. Other configurations of storage dielectric layer 450 may also be useful. The storage unit 410 includes a storage element disposed between bottom and top electrodes, forming a pMTJ element. The storage unit 410, in one embodiment, is a bottom pinned pMTJ storage element, such as that described in FIG. 1 and FIGS. 5-6, as will be described later. Common elements may not be described or described in detail.

In one embodiment, the bottom electrode of the storage unit 410 is coupled to a drain of the select transistor. For example, the bottom electrode is coupled to a contact pad in the M1 level and a via contact in the CA level. Other configurations of coupling the bottom electrode may also be useful. The top electrode is coupled to a bitline BL. For example, the top electrode is coupled to the bitline disposed in M2. The bitline extends along a bitline direction. The source of the select transistor is coupled to the source line. The source line, for example, may be in the first or wordline direction. Providing a source line in the second or bitline direction may also be useful. For example, a via contact in CA is provided to couple the source region to source line SL in M1. Providing source line SL in other levels may also be useful.

The gate of cell selector is coupled to a wordline WL. The wordline, for example, extends along a wordline direction. The bitline and wordline directions are perpendicular to each other. As shown, wordline WL is disposed in M3. Wordline WL may be coupled to the gate by contact pads in M2 and M1 and via contacts in V2 and V1 (not shown). Other configurations of coupling the wordline WL to the gate may also be useful. For example, the wordline WL may be disposed in other metal levels.

In general, lines that are parallel in a first direction may be formed in the same metal level while lines that are in a second direction perpendicular to the first may be formed in a different metal level. For example, WLs and BLs are formed in different metal levels.

As described, the cell dielectric 450 is disposed in V1 in between M1 and M2. It is understood that providing other configurations of cell dielectric layers may be also useful.

Figure 5:
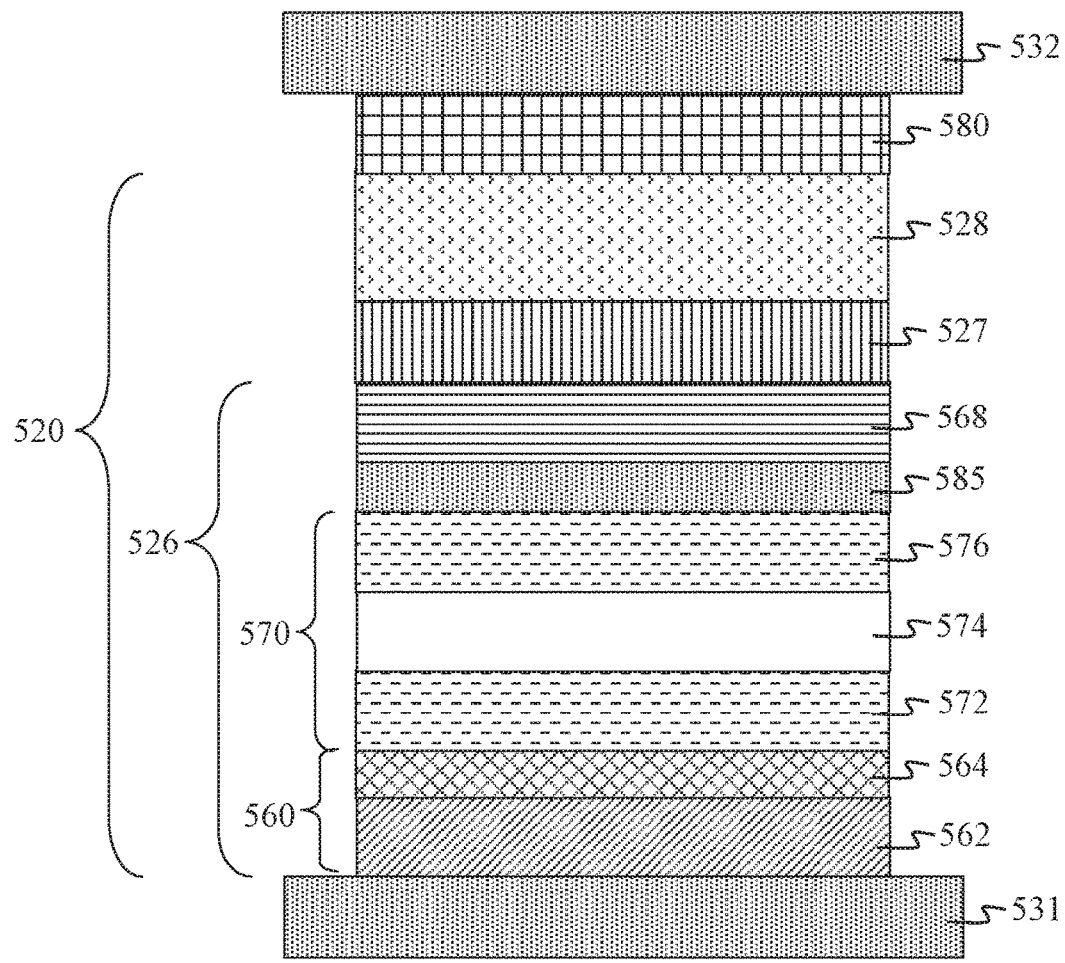
FIGS. 5 and 6 are cross-sectional views of exemplary embodiments of a storage unit of a magnetic memory cell.

FIG. 5 shows a cross-sectional view of an embodiment of a magnetic storage unit 510 for use as the storage unit 410 of the memory cell 400 of FIG. 4. In one embodiment, the magnetic storage unit 510 includes a bottom pinned pMTJ stack or element 520 disposed between a bottom electrode 531 and top electrode 532. The exemplary pMTJ stack 520 includes a fixed layer 526, a free layer 528, and a tunnel barrier layer 527 separating the fixed layer 526 from the free layer 528. As shown, the fixed layer 526 is disposed below the free layer 528, forming the bottom pinned pMTJ stack 520. A capping layer 580 is disposed over the free layer 528. The fixed layer 526, tunnel barrier layer 527 and the free layer 528 form the pMTJ stack 520.

The bottom and top electrodes 531 and 532 may be formed of a conductive material. In one embodiment, the bottom and top electrodes 531 and 532 may be formed of tantalum (Ta), titanium (Ti), tantalum nitride (TaN), titanium nitride (TiN) or a combination of such electrode materials. Furthermore, it is understood that the bottom and top electrodes 531 and 532 need not be of the same material. A thickness of the bottom and top electrodes 531 and 532 may be from about 1 to about 100 nm. Furthermore, it is understood that the bottom and top electrodes 531 and 532 need not be of the same thickness.

The various layers of the pMTJ stack 520 will be described from the bottom electrode 531 up to the top electrode 532. As shown, fixed layer 526 is located on the bottom electrode 531. An exemplary fixed layer 526 is a fixed layer stack that includes a base layer 560 and a hard layer 570.

The base layer 560 promotes orientation of the hard layer 570 in a desired crystal structure or orientation to increase perpendicular magnetic anisotropy (PMA). In an embodiment, the base layer 560 promotes face-centered cubic (FCC) crystal structure of the hard layer 570 along the (111) orientation. Other embodiments may promote body-centered cubic (BCC) crystal structure of the hard layer 570 along the (110) orientation or hexagonal close packed (HCP) crystal structure of the hard layer 570 along the (0002) orientation.

In one embodiment, the base layer 560 includes an optional wetting layer 562 and a seed layer 564. If used, the wetting layer 562 promotes adhesion between the bottom electrode 531 and the seed layer 564. An exemplary wetting layer 562 has a BCC (110), FCC (111) or HCP (0002) orientation. Further, an exemplary wetting layer 562 enhances a BCC (110), FCC (111) or HCP (0002) structure of the seed layer 564. In one embodiment, the wetting layer 562 is a magnesium (Mg) layer, a hafnium (Hf) layer, a tantalum (Ta) layer, a titanium (Ti) layer, a platinum manganese (PtMn) layer, a ruthenium (Ru) layer, a platinum (Pt) layer or a combination thereof. The wetting layer may be considered to be a stain suppression layer (SSL) such as a layer of tantalum (Ta), magnesium oxide (MgO), cobalt iron boron (CoFeB), iron boron (FeB), ruthenium (Ru) or iridium (Ir), molybdenum (Mo) or platinum (Pt), chromium (Cr), nickel chromium (NiCr) or combination thereof. An exemplary wetting layer has a thickness of from more than about 0 to about 100 A, such as from about 1 to about 20 A. The thickness of the wetting layer 562 may be about 10 A. Other thicknesses may also be useful. The wetting layer 562 may be formed by PVD.

If used, the wetting layer 562 may include multiple layers. The multiple layers include magnesium and other material layers that together promote the desired crystal structure along the desired orientation. For example, the multiple layers may include layers having an FCC structure along (111) orientation, layers having a BCC structure along (110) orientation and layers having a HCP structure along the (0002) orientation. Exemplary layers having an FCC (111) structure include magnesium (Mg), exemplary layers having a BCC (110) include molybdenum (Mo), chromium (Cr), tungsten (W), niobium (Nb) and vanadium (V) layers, and exemplary layers having a HCP (0002) wetting layer 562 may include hafnium (Hf) and ruthenium (Ru) layers. Other suitable types of FCC (111), BCC (110) and HCP (0002) layers may also be used as the wetting layer 562 as long as these layers promote FCC crystal structure of the hard layer 570 along the desired orientation.

In certain embodiments, the wetting layer 562 has a smooth surface with a roughness of less than about 4 A root mean squared (RMS). For example, the wetting layer 562 may have a roughness of less than about 1 A RMS. The smoothness of the wetting layer 562 enhances the smoothness of the seed layer 564 formed thereon.

In FIG. 5, the seed layer 564 is illustrated as being formed on the wetting layer 562. As noted above, the wetting layer 562 may not be present in certain embodiments such that the seed layer 564 is formed on the bottom electrode 531. An exemplary seed layer 564 includes only chromium (Cr). Another exemplary seed layer 564 includes only chromium and one other material such as ruthenium (Ru), platinum (Pt), iridium (Ir), or nickel (Ni). Another exemplary seed layer 564 includes ruthenium, platinum, iridium, nickel, or a combination thereof, in addition to chromium. In other exemplary embodiments, the seed layer 564 includes nickel (Ni) and chromium (Cr). For example, the seed layer 564 may include one or more (Ni/Cr) bilayers, i.e., distinct layers of nickel (Ni) and chromium (Cr). In embodiments the seed layer 564 may be multiple bilayers, i.e., multilayers, of (Ni/Cr). For example, the seed layer 564 may be (Ni/Cr)n, wherein n is the number of bilayers such as from 1 to 30. An exemplary seed layer 564 is a superlattice or multilayers of (Ni/Cr)n. In embodiments in which the seed layer 564 is formed from bilayers of nickel and chromium, the seed layer 564 may have a thickness of from about 5 A to about 100 A, for example from about 30 A to about 40 A. In other embodiments the seed layer is a non-magnetic alloy of nickel and chromium. For either embodiment of seed layer 564, the seed layer 564 may be used in a memory cell including a cobalt/platinum (Co/Pt) based pMTJ stack, though the memory cell may include a cobalt/nickel (Co/Ni) based pMTJ stack.

In certain embodiments, the seed layer 564 may be a non-magnetic alloy of chromium and a material (Z) selected from ruthenium, platinum, iridium, and nickel. For example, the alloy may be $Cr_xZ_y$, wherein $0.5 < x < 1$, $0 < y < 0.5$, and $x+y=1$. In an exemplary embodiment, the seed layer is a nonmagnetic alloy of $Cr_xRu_y$, wherein $0.5 < x < 1$, $0 < y < 0.5$, and $x+y=1$. The seed layer 564 may be a single chromium alloy layer.

In other embodiments, the seed layer 564 includes multiple bilayers, forming a multi-bilayered seed stack or seed layer 564. The seed layer 564 may include alternating layers of chromium and a second material (Z) selected from ruthenium, platinum, iridium, and/or nickel, i.e., Cr/Z multilayers, such as Cr/Ru multilayers, in a superlattice formation. In an exemplary embodiment, the seed layer includes a bilayer or a multilayer chromium/second material superlattice structure including from 1 to 30 bilayers.

Further, an exemplary seed layer 564 has a thickness of less than about 100 A. For example, the seed layer 564 may have a thickness of from about 2 A to about 80 A, such as from about 5 A to about 60 A, such as about 50 A. A thinner seed layer 564 reduces total interface or surface roughness of the fixed layer 526. In certain embodiments, seed layer 564 has a smooth surface with a roughness of less than about 4 A root mean squared (RMS). For example, the seed layer 564 may have a roughness of less than about 1 A RMS. The reduced interface roughness improves thermal endurance. The structure may withstand processing at about 400° C. for at least 30 minutes. This enables compatibility with complementary metal oxide semiconductor (CMOS) processes.

The seed layer 564 has a desired texture to produce strong PMA. An exemplary seed layer 564 has a BCC (110), FCC (111) or HCP (0002) orientation. In one embodiment, the texture of a multi-bilayered seed layer 564 has a FCC structure along the (111) orientation. A bilayer of the seed layer 564, in one embodiment, includes a first layer Y having a thickness t1 and a second layer X having a thickness t2. The first layer Y, for example, may be disposed below the second layer X. The thickness t1 may be less than an atomic mono layer and t2 may be less than an atomic mono layer. For example, t1 may be from about 1.5 to 3.5 A and t2 may be about 1.5 to 3.5 A. The layers of the bilayer structures may be formed by PVD.

In one embodiment, the multi-bilayered seed layer 564 is defined by (Yt1/Xt2)n, where t1 is the thickness of layer Y, t2 is the thickness of layer X, and n is the number of bilayers. The value of n may be from about 2 to about 20. The total thickness T of a seed layer 564 is equal to $(t1+t2)*n$. For the first seed bilayer, n may be designated as n1 and for the second seed bilayer, n may be designated as n2. In one embodiment, the total thickness T of the seed layer 564 is about 100 A or less. An exemplary seed layer 564 has a thickness of less than about 60 A.

In one embodiment, layer Y is a magnetic layer. For example, layer Y may be nickel (Ni), cobalt nickel (CoNi) or nickel iron (NiFe). Other types of magnetic layers may also be useful. Layer X may be a non-magnetic layer having a BCC structure along the (110) orientation with high recrystallization temperature. Providing a non-magnetic layer having a BCC structure in the (110) orientation with high recrystallization temperature improves thermal endurance. An exemplary layer X, for example, is a chromium (Cr), molybdenum (Mo), tungsten (W), niobium (Nb) or vanadium (V) layer. In one embodiment, a bilayer of the seed layer includes nickel/chromium (Ni/Cr) layers. For example, the seed layer is formed of a superlattice or layer or multilayers of (Ni/Cr)$_n$, wherein n is the number of bilayers such as from 1 to 20. Other suitable types of bilayers may also be useful. For example, other combinations of Y and X may be selected. It is understood that not all bilayers of the seed layer 564 need to be the same.

In FIG. 5, hard layer 570 is formed over the base layer 560. For example, the hard layer 570 is formed on the seed layer 564 of the base layer 560. The hard layer 570, in one embodiment, is a composite hard layer 570 with multiple layers to form a hard layer stack. In one embodiment, the hard layer 570 includes first and second anti-parallel (AP) layers 572 and 576 separated by a coupling layer 574, such as a synthetic anti-ferromagnetic (SAF) layer. Layers 572 and 576 are magnetic, while layer 574 is not magnetic.

In one embodiment, the anti-parallel layers 572 and 576 are configured with a FCC structure along the (111) orientation. Formation of layers in the (111) orientation, as discussed, is facilitated by the base layer 560. The magnetic layers 572 and 576 of the hard layer 570 may be selected and arranged such that the direction of the magnetization orientation for the layers 572 and 576 are aligned anti-parallel to each other at their minimum energy state, but are aligned parallel to each other when a high magnetic field is applied.

Each or either anti-parallel layer 572 or 576 may include multiple bilayers, forming an anti-parallel bilayered stack or layer. An exemplary bilayer of an anti-parallel layer 572 or 576 may include cobalt/platinum (Co/Pt) or cobalt/nickel (Co/Ni) layers. A bilayer of an anti-parallel layer 572 or 576 may be cobalt/nickel (Co/Ni). Other types of anti-parallel layers 572 or 576, such as cobalt-iron/nickel (CoFe/Ni), cobalt-iron-boron/nickel (CoFeB/Ni), cobalt-iron/platinum (CoFe/Pt)n or cobalt-iron-boron/platinum (CoFeB/Pt)m, may also be useful. Layers in an anti-parallel layer 572 or 576 may be provided in any sequence. In one embodiment, the nickel layer is the uppermost layer of the anti-parallel layer 572 or 576. For example, depending on the configuration, the uppermost layer may be a bilayer with nickel as the top layer, or may be a single layer of nickel. In an embodiment, anti-parallel layer 572 or 576 can be a single magnetic layer or a composite layer of cobalt/platinum/cobalt (Co/Pt/Co), cobalt/nickel/cobalt (Co/Ni/Co), cobalt-iron/platinum/cobalt-iron (CoFe/Pt/CoFe), cobalt-iron/nickel/cobalt-iron (CoFe/Ni/CoFe), cobalt-iron-boron/platinum/cobalt-iron-boron (CoFeB/Pt/CoFeB), or cobalt-iron-boron/nickel/cobalt-iron-boron (CoFeB/Ni/CoFeB).

In an embodiment, the coupling layer 574 serves to promote Ruderman-Kittle-Kasuya-Yosida (RKKY) coupling, or more generally exchange coupling. An exemplary coupling layer 574 is a ruthenium (Ru) layer or an iridium (Ir) layer. Providing other types of coupling layers may also be useful. The various layers of the hard layer 570 may be formed by PVD.

In the embodiment of FIG. 5, a magnetically continuous transition layer 585 is disposed over the hard layer 570. Specifically, the magnetically continuous transition layer 585 is disposed over the anti-parallel layer 576, and between the anti-parallel layer 576 and the reference layer 568. An exemplary magnetically continuous transition layer 585 serves to couple the magnetically hard layer 570 to the polarizing or reference layer 568 below the tunnel barrier layer 527 in order to yield high temperature thermal stability (usually up to about 400° C.), high TMR, and roughness suppression if certain conditions are met, such as a magnetically continuous transition layer 585 which is mostly amorphous and thick enough to improve the extrinsic properties of the tunnel barrier and reduce TDDB. The magnetically continuous transition layer 585 should be thick, such as from about 4 A to about 10 A, for example about 8 A.

In an exemplary embodiment, the magnetically continuous transition layer is an alloy of iron (Fe), cobalt (Co), nickel (Ni), boron (B), or combinations thereof. In another exemplary embodiment, the magnetically continuous transition layer includes a magnetic sublayer and a non-magnetic sublayer. An exemplary magnetic sublayer is selected from iron (Fe), cobalt (Co), nickel (Ni), cobalt iron boride (CoFeB), iron boron (FeB) or combination of thereof. An exemplary non-magnetic sublayer is selected from molybdenum (Mo), tungsten (W), niobium (Nb), vanadium (V), zirconium (Zr), chromium (Cr), tantalum (Ta), titanium (Ti) or combination of thereof.

In certain embodiments, the magnetically continuous transition layer 585 includes a magnetic sublayer of cobalt iron boron and a non-magnetic sublayer of molybdenum or tungsten. In such embodiments, the magnetically continuous transition layer 585 may have a non-magnetic concentration of at least about 10%, such as from about 40% to about 60%, for example about 50%. An exemplary magnetically continuous transition layer 585 includes a magnetic sublayer of cobalt iron boron and a non-magnetic sublayer of molybdenum, wherein the magnetically continuous transition layer 585 has a molybdenum concentration of about 50%. Another exemplary magnetically continuous transition layer 585 includes a magnetic sublayer of cobalt iron boron and a non-magnetic sublayer of tungsten, wherein the magnetically continuous transition layer 585 has a tungsten concentration of about 50%.

As noted about, the magnetically continuous transition layer 585 may be a single layer or may be formed with sublayers. For example, the magnetically continuous transition layer 585 may be a hybrid or composite layer including two or more sublayers. The composite or hybrid layers can include alloys or multilayer formations of magnetic layer(s) and non-magnetic layer(s), such as in a stack of magnetic, non-magnetic, and magnetic sublayers.

The reference layer 568, in one embodiment, is a magnetic layer. An exemplary reference layer 568 is a cobalt-iron-boron (CoFeB) layer. Other suitable types of magnetic reference layers 568 may also be useful. In one embodiment, the reference layer 568 is deposited by, for example, PVD. In an exemplary embodiment, reference layer 568 is deposited as an amorphous layer. Depositing the reference layer 568 as an amorphous layer enhances TMR when the amorphous layer is subsequently recrystallized during a post anneal performed on the MTJ stack. The reference layer 568 should be sufficiently thick without sacrificing the perpendicular magnetic anisotropy (PMA). The thickness of an exemplary reference layer 568 may be from about 5 to about 13 A thick. Forming the reference layer 568 using other techniques or processes as well as other thicknesses may also be useful.

The tunnel barrier layer 527 that is disposed over the hard layer 570 may be a magnesium oxide (MgO) layer. Other suitable types of barrier layers 527 may also be useful. The tunnel barrier layer 527 may be formed by PVD. The thickness of the tunnel barrier layer 527 may be from about 1 to about 20 A. An exemplary tunnel barrier layer 527 has a thickness of from about 8 to about 12 A. Other forming techniques or thicknesses for the tunnel barrier layer 527 may also be useful.

As shown in FIG. 5, the free or storage layer 528 is disposed over the tunnel barrier layer 527. The exemplary storage layer 528 is a magnetic layer. In one embodiment, the storage layer 528 may be a cobalt-iron-boron (CoFeB) layer. The storage layer 528 may be a single layer or a composite layer. The thickness of the storage layer 528 may be from about 10 to about 20 A to maintain PMA. An exemplary composite storage layer 528 may include a magnetic/non-magnetic/magnetic stack. The magnetic layer may be cobalt-iron-boron (CoFeB) while the non-magnetic layer may be molybdenum (Mo), tantalum (Ta), tungsten (W), chromium (Cr), palladium (Pd) or platinum (Pt). The non-magnetic layer is thin, such as from about from about 1 to about 20 A to avoid magnetic decoupling of the magnetic layer of the composite storage layer 528. The storage layer 528 may be formed by, for example, PVD. Other techniques for forming the storage layer 528 or thicknesses may also be useful.

A capping layer 580 is provided over the storage layer 528. The capping layer 580, for example, serves to minimize the top electrode diffusion through the tunnel barrier layer 527 or magnetic layers. An exemplary capping layer 580 is a ruthenium (Ru) layer or a tantalum (Ta) layer. Providing a composite capping layer 580 may also be useful. For example, the capping layer 580 may include ruthenium and tantalum layers. In one embodiment, the capping layer 580 may include a ruthenium/cobalt-iron/tantalum (Ru/CoFe/Ta) or a ruthenium/cobalt-iron-boron/tantalum (Ru/CoFeB/Ta) composite layer. In the case of the composite capping layer 580, the ruthenium layer may be about 10 A thick, the CoFeB or CoFe layer may be about 15 A thick, and the Ta layer may be about 100 A thick. Other configurations of capping layers 580 may also be useful. The capping layer 580 may be formed by, for example, PVD.

Figure 6:
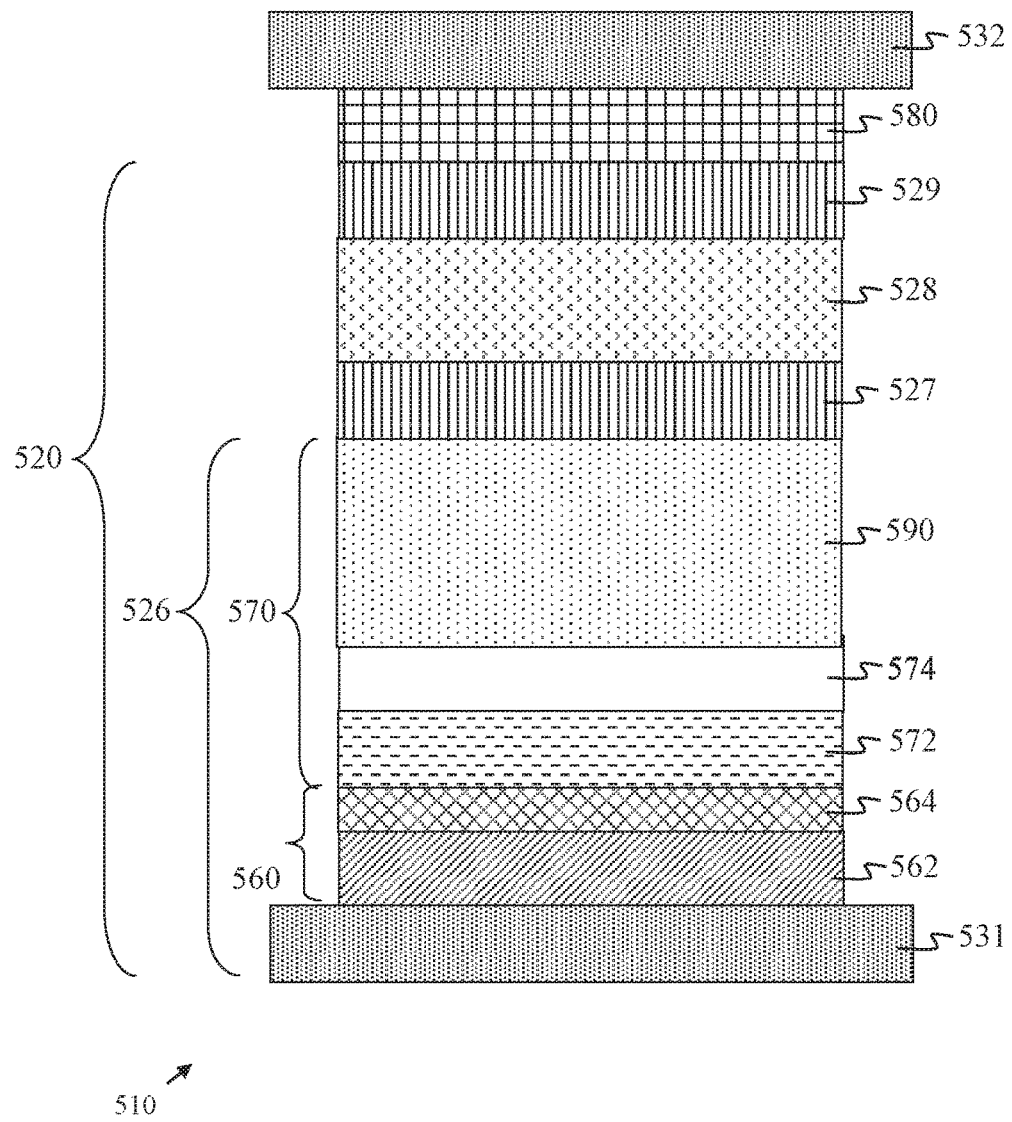

FIG. 6 shows a cross-sectional view of another embodiment of a magnetic storage unit 510 of a magnetic memory cell. In the embodiment of FIG. 6, the magnetic storage unit 510 again includes a bottom pinned pMTJ stack or element 520 disposed between bottom and top electrodes 531 and 532. The pMTJ stack 520 is similar to that described in FIG. 5 and common elements are not described in detail.

In contrast to the magnetic storage unit 510 of FIG. 5, the magnetic storage unit 510 of FIG. 6 includes a first tunnel barrier layer 527 and a second tunnel barrier layer 529. This configuration produces a dual tunnel barrier pMTJ stack 520. In one embodiment, the free layer 528 is disposed between the tunnel barrier layers 527 and 529. The tunnel barrier layers 527 and 529, for example, may be magnesium oxide (MgO) layers. Other suitable types of tunnel barrier layers may also be useful. It is also understood that the tunnel barrier layers 527 and 529 need not be the same. The other layers of the pMTJ stack 520 may be the same or similar to those described above in relation to FIG. 5.

In one embodiment, the first tunnel barrier layer 527 has resistance area (RA) of from about 8 to about 20 Ohms/um$^2$, such as about 9 Ohms/um$^2$ while the second tunnel barrier layer 529 has a RA of less than about 2 Ohms/um$^2$, such as about 0.5 Ohms/um$^2$. The differing resistance areas of the first tunnel barrier layer 527 and the second tunnel barrier layer 529 may be achieved by differences in thickness of the layers 527 and 529 and/or by process optimization. The second tunnel barrier layer 529 enhances anisotropy of the storage layer 528, increasing thermal stability. Additionally, the second tunnel barrier layer 529 reduces the damping effect of the storage layer 528, reducing switching current.

Further, unlike the magnetic storage unit 510 of FIG. 5, the magnetic storage unit 510 of FIG. 6 does not include a second anti-parallel layer 576, magnetically continuous transition layer 585, and reference layer 568. Rather, these layers are replaced by a magnetic hard layer 590. As shown the magnetic hard layer 590 is disposed over the synthetic anti-ferromagnetic layer 574, and the first tunnel barrier layer 527 is disposed over the magnetic hard layer 590. The magnetic hard layer 590 may be deposited by PVD.

The magnetic hard layer 590 has perpendicular magnetic anisotropy (PMA) and may enhance the TMR. Further, the magnetic hard layer 590 provides for high temperature sustainability, high TMR, roughness suppression and hence, improves the extrinsic properties of the tunnel barrier and reduces TDDB.

In an exemplary embodiment, the magnetic hard layer 590 has a thickness of from about 6 A to about 35 A. The magnetic hard layer 590 may be provided as a single layer or as a formation or stack of composite or hybrid sublayers. An exemplary single layer is a magnetic layer. Exemplary composite or hybrid sublayers can be alloys or multilayer formations of magnetic layer(s) and non-magnetic layer(s). In certain embodiments, the magnetic hard layer 590 may be formed as a magnetic layer(s)/non-magnetic layer(s)/magnetic layer(s) stack. In an exemplary embodiment, the magnetic hard layer 590 is a composite structure of magnetic and non-magnetic sublayers, wherein the magnetic layer or sublayer is selected from iron (Fe), cobalt (Co), nickel (Ni), cobalt iron boride (CoFeB), iron boron (FeB) or combination of thereof, and wherein the non-magnetic sublayer is selected from molybdenum (Mo), tungsten (W), niobium (Nb), vanadium (V), zirconium (Zr), chromium (Cr), tantalum (Ta), titanium (Ti) or combination of thereof.

As shown in FIG. 6, the magnetic hard layer 590 may be disposed on the synthetic anti-ferromagnetic layer 574, the tunnel barrier layer 527 may be disposed on the magnetic hard layer 590, and the storage layer 528 may be disposed on the tunnel barrier layer 527. The magnetic hard layer 590, the tunnel barrier layer 527, and the storage layer 528 form a magnetic tunnel junction (MTJ) element with a perpendicular orientation.

While FIGS. 5 and 6 illustrate several differences, it is contemplated that a single feature from the embodiment of FIG. 6 may be incorporated in the embodiment of FIG. 5, and vice versa. Accordingly, any feature described in FIGS. 5 and 6 may be implemented in an embodiment. For example, the illustrated embodiment of FIG. 5 includes layers 576, 585, 568 instead of layer 590 and further does not include layer 529, while the illustrated embodiment of FIG. 6 includes layer 590 instead of layers 576, 585, 568 and further includes layer 529. Another embodiment may include layer 590 instead of layers 576, 585, 568 and further not include layer 529. A further embodiment may include layers 576, 585, 568 instead of layer 590 and further include layer 529.

FIGS. 7-18 show cross-sectional views of an embodiment of a process 600 for forming a device including a memory cell, such as a magnetic random access memory (MRAM) cell. An exemplary memory cell is the same or similar to that described in relation to FIG. 2 and includes an MTJ stack as described in FIGS. 5-6. Common elements may not be described or described in detail.

The cross-sectional views of FIGS. 7-18 are along the bit line direction. Although the cross-sectional views show one memory cell, it is understood that the device may include a plurality of memory cells, such as cells forming a memory array. In one embodiment, the process of forming the memory cell is highly compatible with CMOS logic process.

For example, the cells can be formed simultaneously with CMOS logic devices (not shown) on the same substrate.

Figure 7:
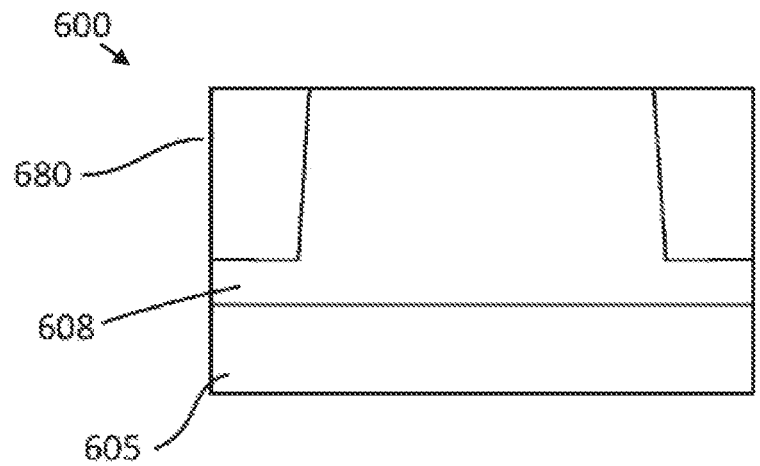
FIGS. 7-18 are cross-sectional views illustrating a process for forming a memory cell in accordance with an embodiment herein.

Referring to FIG. 7, a substrate 605 is provided. An exemplary substrate 605 is a semiconductor substrate, such as substrate 405 as described above in relation to FIG. 4. Substrate 605 is processed to define a cell region in which a memory cell is formed. The cell region may be part of an array region that includes a plurality of cell regions. Substrate 605 may include other types of device regions, such as logic regions or other types of regions.

Isolation regions 680 are formed in substrate 605. In one embodiment, isolation regions 680 are shallow trench isolation (STI) regions. Other types of isolation regions may also be useful. Isolation regions 680 are provided to isolate device regions from other regions and may also isolate contact regions within a cell region. Isolation regions 680 may be formed by, for example, etching trenches in the substrate 605 and filling them with a dielectric material, such as silicon oxide. A planarization process, such as chemical mechanical polish (CMP), may be performed to remove excess dielectric material.

As shown in FIG. 7, a doped well or device well 608 is formed in substrate 605. In an exemplary embodiment, well 608 is formed after isolation regions 680 are formed. In one embodiment, the well 608 serves as a well for select transistors of a selector unit. An exemplary well 608 is a second polarity type doped well, i.e., the opposite polarity type of the transistor of the cell selector unit. In an embodiment, device well 608 is a p-type well for a n-type cell select transistor, such as a metal oxide semiconductor field effect transistor (MOSFET). Device well 608 may serve as a body of the select transistor.

In an embodiment, an implant mask may be employed to implant dopants to form doped well 608. The implant mask, for example, is a patterned photoresist layer. The implant mask exposes regions of substrate 605 where the second polarity wells are formed. Device well 608 may be lightly or intermediately doped with second polarity type dopants. For example, device well 608 may have a dopant concentration of about 1E15 to 1E19/cm$^3$. Other dopant concentrations may also be useful. An exemplary well 608 may be a common device well for a memory array.

The process may include forming other wells for other device regions. In the case where the wells are different polarity type of dopant concentration, they may be formed using separate processes, such as separate mask and implants. For example, first polarity typed doped wells, wells of different dopant concentrations as well as other wells may be formed using separate mask and implant processes.

Figure 8:
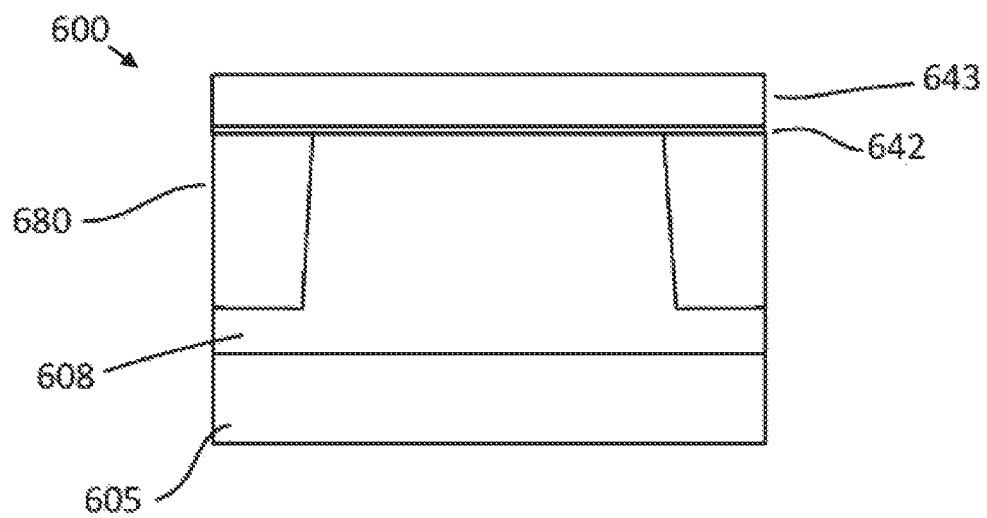

As shown in FIG. 8, gate layers are formed on substrate 605. Exemplary gate layers include a gate dielectric layer 642 and a gate electrode layer 643. An exemplary gate dielectric layer 642 is silicon oxide and may be formed by thermal oxidation. An exemplary gate electrode layer 642 is polysilicon and may be formed by chemical vapor deposition (CVD). Other suitable types of gate layers, including high k dielectric and metal gate electrode layers, or other suitable techniques for forming gate layers may also be useful.

Figure 9:
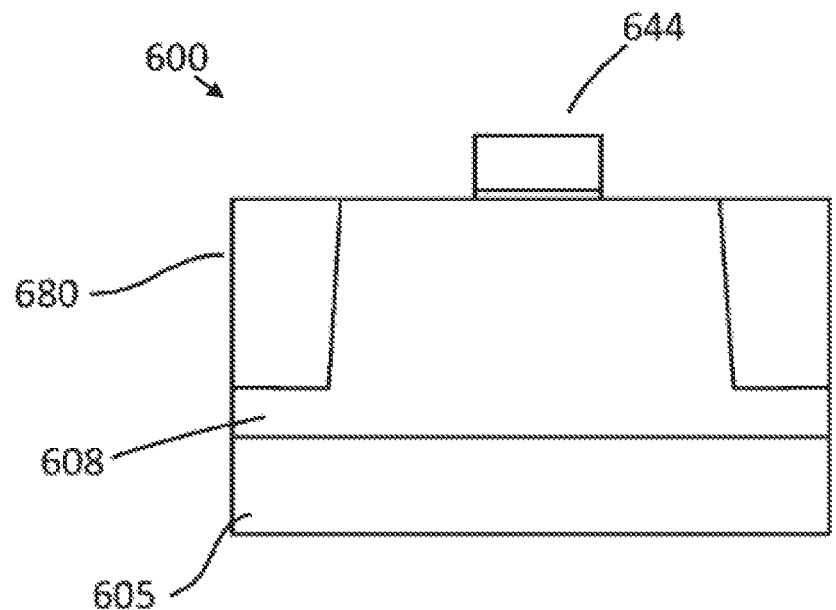

Referring to FIG. 9, gate layers 642 and 643 are patterned to form a gate 644 of the select transistor of the select unit. Patterning the gate layers may be achieved using conventional mask and etch techniques. Patterning the gate layers forms gate 644 of the select transistor. An exemplary gate 644 is a gate conductor extending along a first or word line direction and serves as a common gate for a row of memory cells.

Figure 10:
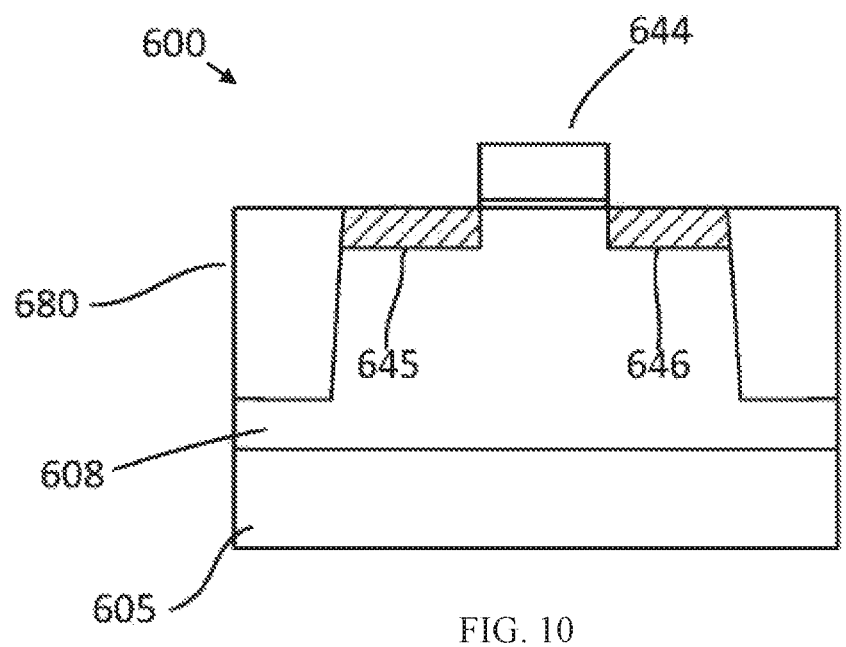

Referring to FIG. 10, an implant is performed to form first and second S/D regions 645 and 646 adjacent gate 644. In an exemplary embodiment, first polarity type dopants are implanted to form first polarity type S/D regions 645 and 646. In one embodiment, the implant forms heavily doped first polarity type S/D regions 645 and 646 in substrate 605 adjacent gate 644. S/D regions 645 and 646, for example, include a dopant concentration of about 5E19 to 1E21/cm$^3$. Other dopant concentrations may also be useful. The implant process to form S/D regions 645 and 646 may be performed together while forming first polarity type S/D regions in other device regions (not shown) on the same substrate as well as first polarity type contact regions.

An extension implant and halo region implant may be performed to form extension regions (not shown) and halo regions (not shown) of S/D regions 645 and 646. The extension and halo implants may be performed prior to forming the S/D regions 645 and 646. After forming the extension regions, sidewall spacers (not shown) may be formed on sidewalls of the gate 644 followed by forming the S/D regions 645 and 646.

Separate implants for second polarity type S/D and extension regions may be performed. The second polarity type implants form S/D and extension regions for second polarity type transistors in other device regions as well as second polarity type contact regions.

Figure 11:
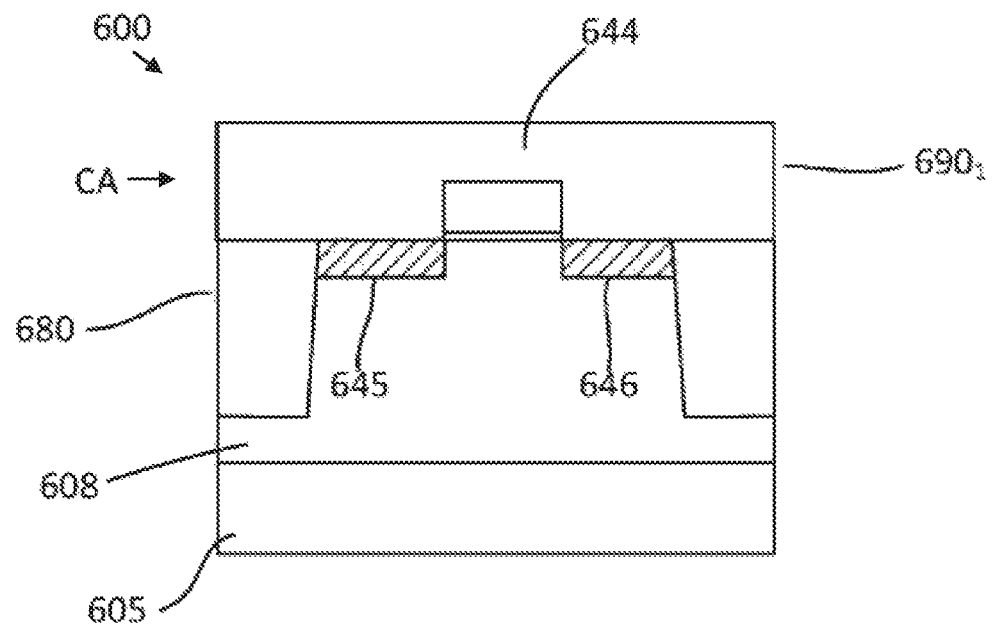

Referring to FIG. 11, a dielectric layer $690_1$ is formed over the substrate 605, and covers gate 644 and S/D regions 645 and 646 of the transistor. An exemplary dielectric layer $690_1$ serves as a dielectric layer of an ILD layer. For example, dielectric layer $690_1$ serves as a PMD or CA level of an ILD layer. An exemplary dielectric layer $690_1$ is silicon oxide, though other types of dielectric layers may also be useful. Dielectric layer $690_1$ may be formed by CVD. Other techniques for forming the dielectric layer $690_1$ may also be useful. A planarizing process, such as CMP, may be performed to produce a planar surface. Other types of planarizing processes may also be useful.

Figure 12:
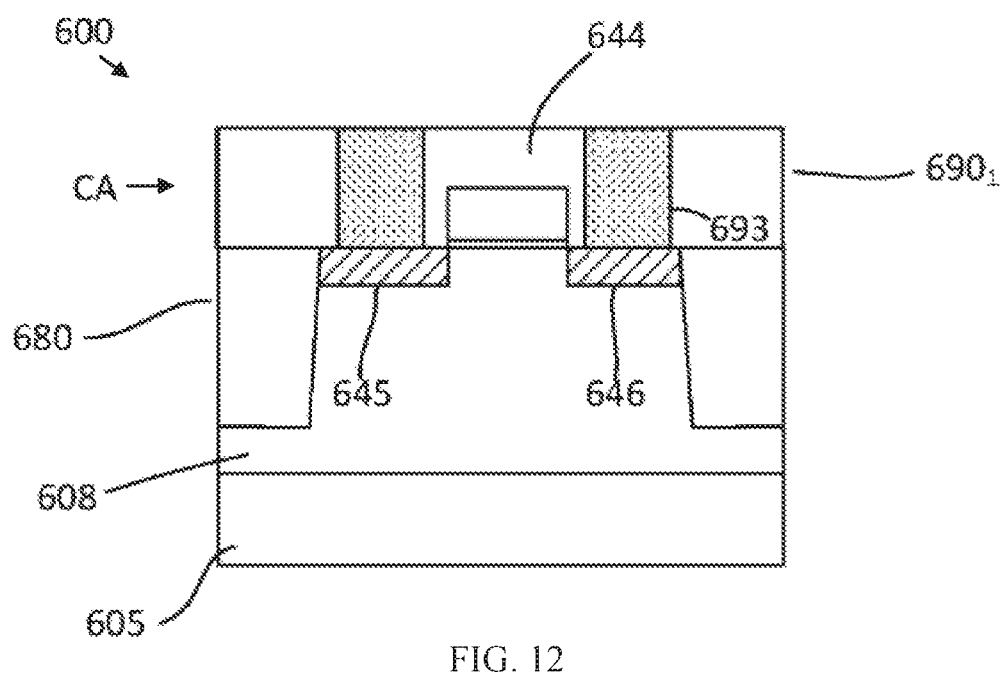

In an exemplary embodiment, contacts 693 are formed in the dielectric layer $690_1$ as shown in FIG. 12. Exemplary contacts 693 connect to contact regions, such as S/D regions 645 and 646 and gate (not shown). Forming contacts 693 may include forming contact vias in dielectric layer $690_1$ to expose the contact regions. Forming the contact vias may be achieved using mask and etch techniques. After the vias are formed, a conductive material is deposited to fill the vias. The conductive material, for example, may be tungsten (W). Other types of conductive materials may also be useful. A planarization process, such as CMP, is performed to remove excess conductive material, leaving contact plugs in the contact vias.

Figure 13:
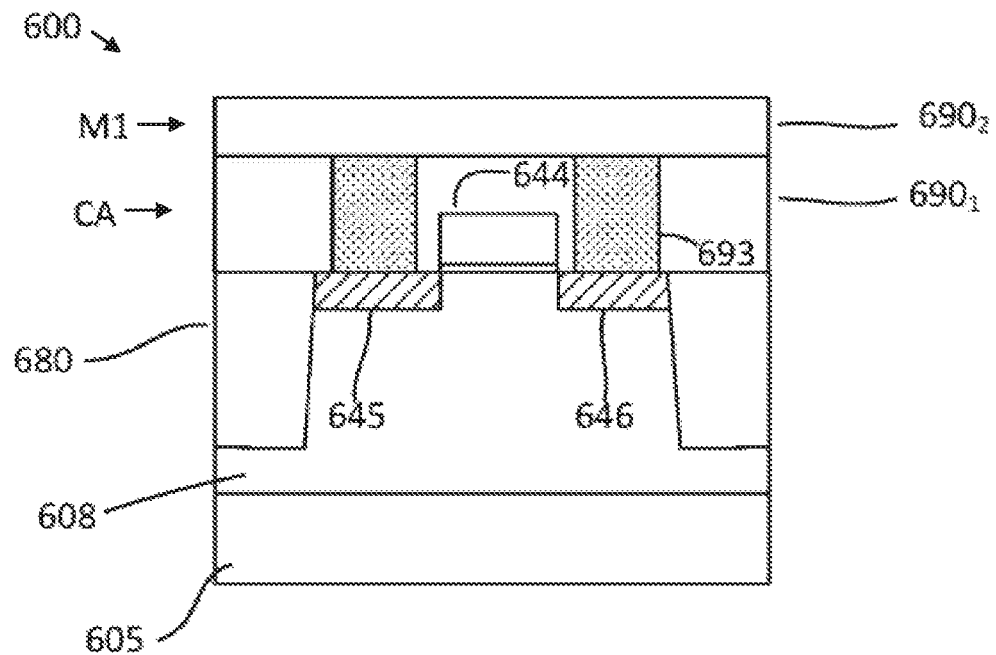

In FIG. 13, a dielectric layer $690_2$ is formed over the substrate 605, covering the lower dielectric layer $690_1$. An exemplary dielectric layer $690_2$ serves as a metal level of an ILD layer. In an embodiment, dielectric layer $690_2$ serves as M1 level of the ILD layer. An exemplary dielectric layer $690_2$ is silicon oxide, though other types of dielectric layers may also be useful. Dielectric layer $690_2$ may be formed by CVD. Other techniques for forming the dielectric layer $690_2$ may also be useful. Because the underlying surface is already planar, a planarizing process may not be needed. However, it is understood that a planarization process, such as CMP, may be performed if desired to produce a planar surface.

Figure 14:
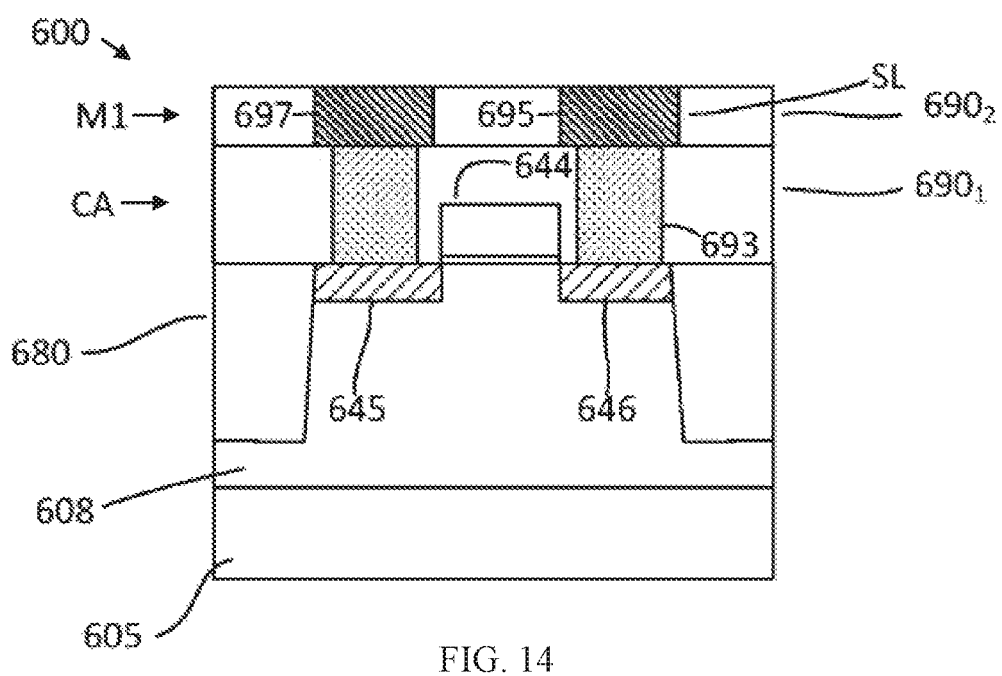

In FIG. 14, conductive or metal lines 695 are formed in the dielectric layer 690$_2$. Conductive lines 695 may be formed by damascene technique by etching upper dielectric layer 690$_2$ to form trenches and filing the trenches with a conductive layer. For example, a copper or copper alloy layer may be formed to fill the openings. The conductive material may be formed by, for example, plating, such as electro or electroless plating. Other types of conductive layers or forming techniques may also be useful. In one embodiment, a source line SL is formed to connect to the source region 646 of the transistor while other interconnects, such as interconnect pad 697 formed in M1 is coupled to drain region 645. The source line may extend along the wordline direction. Providing the source line in the bitline direction may also be useful. The interconnect pad may serve as a storage pad. Other conductive lines and pads may also be formed.

Figure 15:
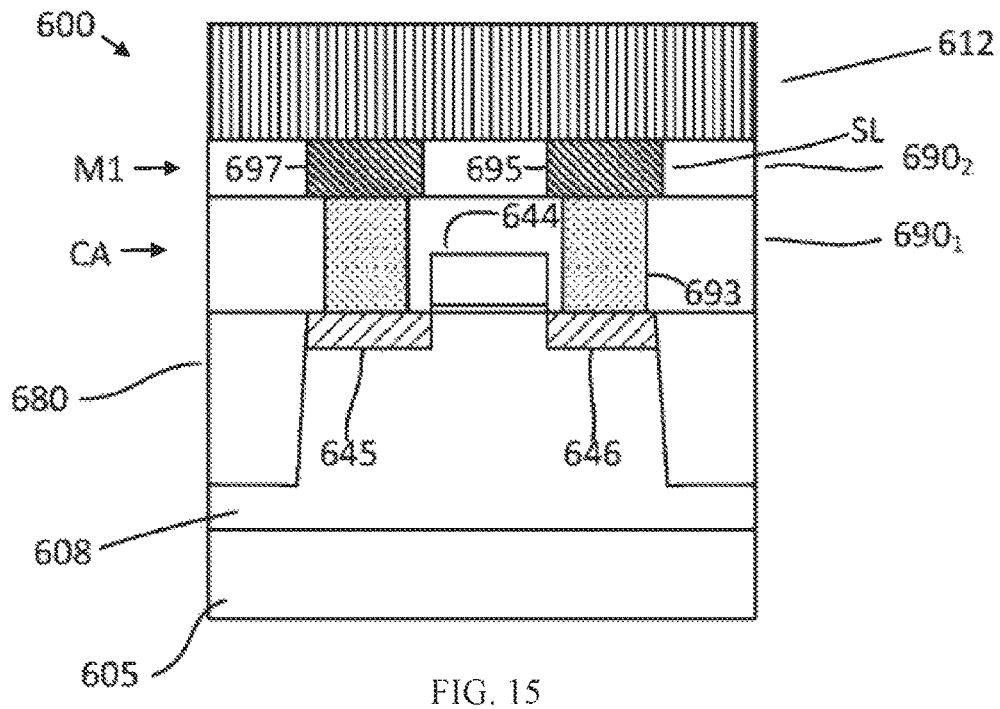

As shown in FIG. 15, the process continues to form a storage unit of the memory cell. In one embodiment, the process forms various layers 612 of a storage unit with a pMTJ stack. The various layers 612 are formed on dielectric layer 690$_2$. The layers 612 may include layers as described in FIG. 5 or 6. The layers 612 may be formed by PVD or other suitable deposition techniques. The deposition technique may depend on the type of layer.

Figure 16:
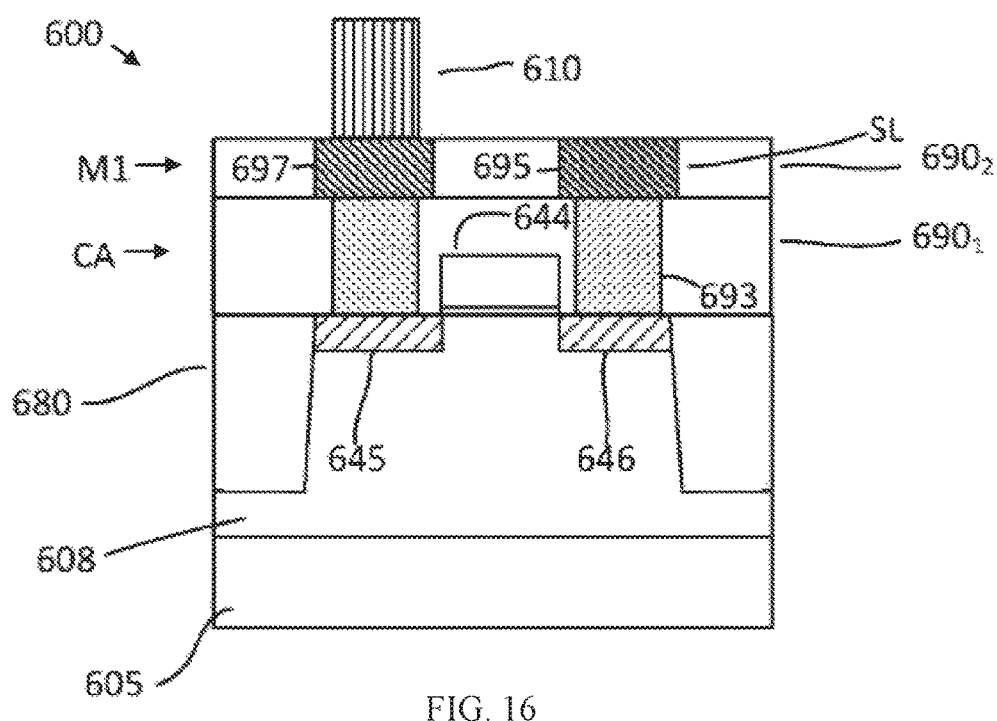

The layers 612 are patterned to form a storage unit 610 with a pMTJ element, as shown in FIG. 16. Patterning the layers 612 may be achieved using an anisotropic etch, such as RIE, with a patterned mask layer. Other techniques for forming the MTJ element may also be useful.

Figure 17:
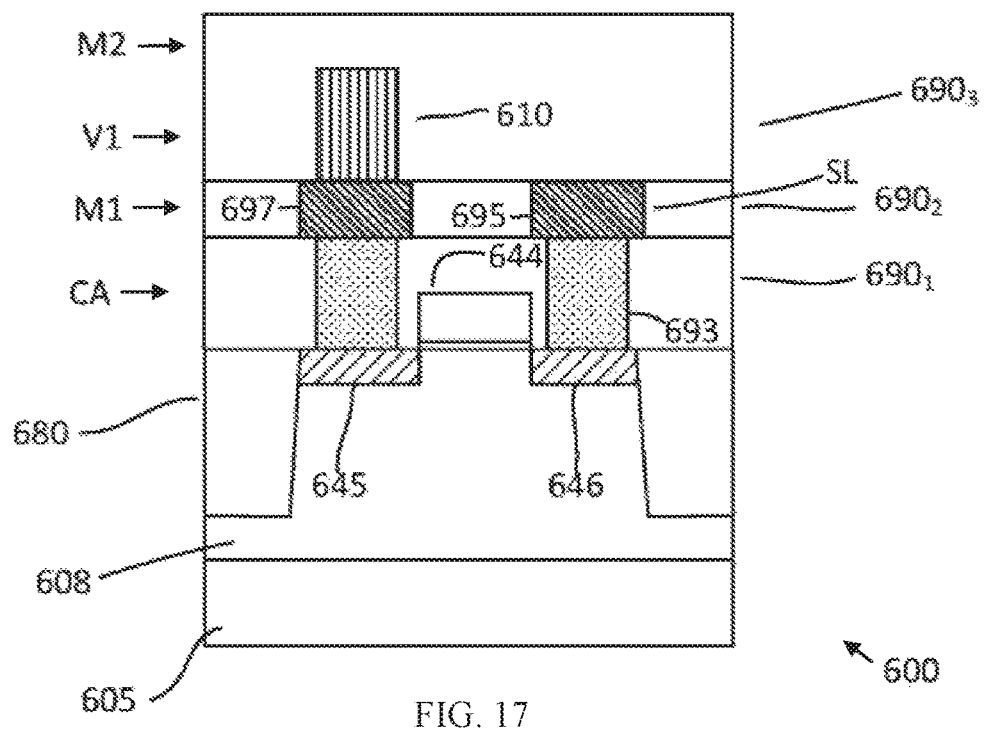

Referring to FIG. 17, a storage dielectric layer 690$_3$ is formed over and covers MTJ storage unit 610. An exemplary storage dielectric layer 690$_3$ is silicon oxide. Storage dielectric layer 690$_3$ may be formed by, for example, CVD. Other types of storage dielectric layers or forming techniques may also be useful. A planarization process, such as CMP, is performed to remove excess dielectric material to form a planar surface. As shown, storage dielectric layer 690$_3$ is disposed above the surface of storage unit 610. An exemplary storage dielectric layer 690$_3$ includes V1 and M1 levels.

Figure 18:
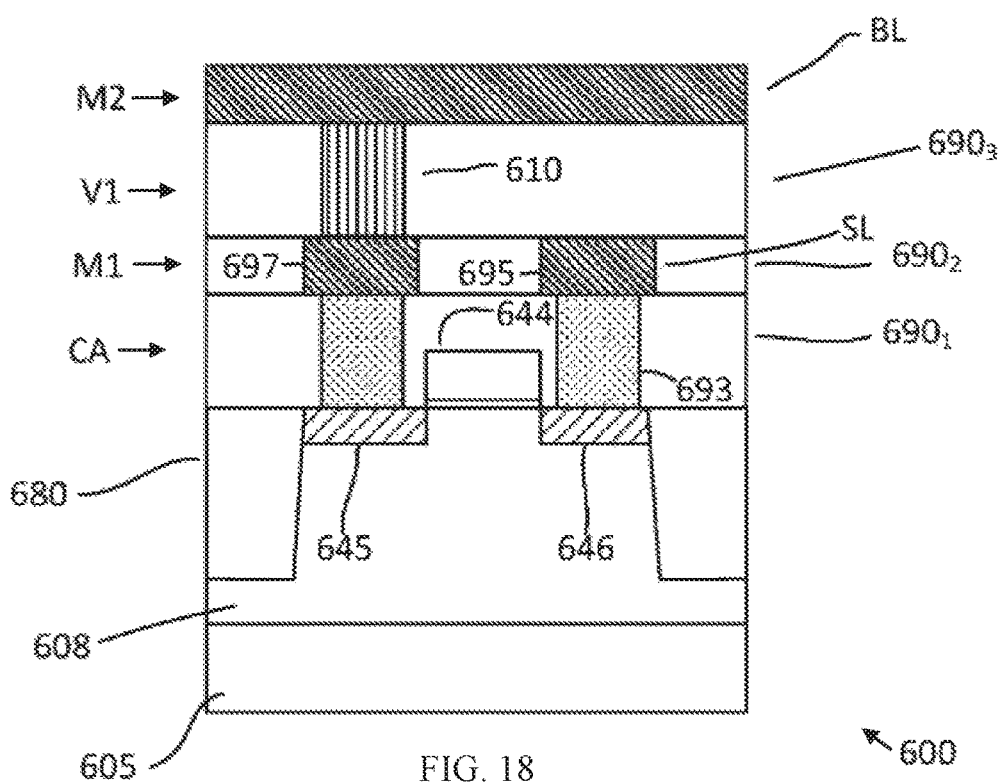

In FIG. 18, a conductive or metal line is formed in the dielectric layer in M2. For example, a bitline BL is formed in M2 of the dielectric layer, coupling to storage unit 610. Other conductive lines may also be formed. The conductive lines in M2 may be formed using a dual damascene technique.

Additional processes may be performed to complete forming the device. For example, the processes may include forming additional ILD, pad, and passivation levels, pad opening, dicing, assembly and testing. Other types of processes may also be performed.

As described, the storage unit is formed in V1 and BL is formed in M2. Forming the storage unit and BL in other ILD levels, such as in an upper ILD level, may also be useful. In the case where the storage unit is provided in an upper ILD level, contact and interconnect pads may be formed in the intermediate ILD levels to connect to the storage unit. The contact and interconnect pads may be formed using dual damascene techniques.

In addition, a metal wordline may be provided in a metal layer above the gate. The metal wordline, for example, may be coupled to the gate of the select transistor. The metal wordline may be provided in M1 or other metal levels. For example, the metal wordline may be parallel with the SL. Also, as described, the various components are disposed in specific via or metal levels. It is understood that other configurations of the memory cell may also be useful. For example, the components may be disposed in other metal or via levels.

The present disclosure may be embodied in other specific forms without departing from the spirit or essential characteristics thereof. The foregoing embodiments, therefore, are to be considered in all respects illustrative rather than limiting. The scope of the subject matter is thus indicated by the appended claims, rather than by the foregoing description, and all changes that come within the meaning and range of equivalency of the claims are intended to be embraced therein.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. A spin transfer torque magnetic random access memory structure having a perpendicular magnetic orientation, comprising:
   a bottom electrode;
   a seed layer over the bottom electrode;
   a hard layer over the seed layer;
   a magnetically continuous transition layer over the hard layer;
   a reference layer over the magnetically continuous transition layer;
   a tunnel barrier layer over the reference layer;
   a storage layer formed over the tunnel barrier layer, wherein the reference layer, the tunnel barrier layer, and the storage layer form a magnetic tunnel junction (MTJ) element with a perpendicular orientation; and
   a top electrode.

2. The spin transfer torque magnetic random access memory structure of claim 1 wherein the magnetically continuous transition layer is an alloy of iron (Fe), cobalt (Co), nickel (Ni), boron (B), or combinations thereof.

3. The spin transfer torque magnetic random access memory structure of claim 1 wherein the magnetically continuous transition layer includes a magnetic sublayer and a non-magnetic sublayer.

4. The spin transfer torque magnetic random access memory structure of claim 1 wherein the magnetically continuous transition layer includes a magnetic sublayer selected from iron (Fe), cobalt (Co), nickel (Ni), cobalt iron boride (CoFeB), iron boron (FeB) or combination of thereof, and a non-magnetic sublayer selected from molybdenum (Mo), tungsten (W), niobium (Nb), vanadium (V), zirconium (Zr), chromium (Cr), tantalum (Ta), titanium (Ti) or combination of thereof.

5. The spin transfer torque magnetic random access memory structure of claim 1 wherein the magnetically continuous transition layer includes a magnetic sublayer of cobalt iron boron (CoFeB) and a non-magnetic sublayer of molybdenum or tungsten.

6. The spin transfer torque magnetic random access memory structure of claim 1 wherein the magnetically continuous transition layer includes a magnetic sublayer of cobalt iron boron (CoFeB) and a non-magnetic sublayer of molybdenum or tungsten, and wherein the magnetically continuous transition layer has a non-magnetic concentration of at least about 10%.

7. The spin transfer torque magnetic random access memory structure of claim 1 wherein the magnetically continuous transition layer includes a magnetic sublayer of cobalt iron boron (CoFeB) and a non-magnetic sublayer of molybdenum, and wherein the magnetically continuous transition layer has a molybdenum concentration of about 40% to about 60%.

8. The spin transfer torque magnetic random access memory structure of claim 1 wherein the magnetically continuous transition layer includes a magnetic sublayer of cobalt iron boron (CoFeB) and a non-magnetic sublayer of tungsten, and wherein the magnetically continuous transition layer has a tungsten concentration of about 40% to about 60%.

9. The spin transfer torque magnetic random access memory structure of claim 1 wherein the magnetically continuous transition layer has a thickness of from about 4 A to about 10 A.

10. The spin transfer torque magnetic random access memory structure of claim 1 wherein the magnetically continuous transition layer has a thickness of about 8 A.

11. The spin transfer torque magnetic random access memory structure of claim 1 wherein the hard layer includes an anti-parallel layer, wherein the magnetically continuous transition layer is disposed on the anti-parallel layer, and wherein the anti-parallel layer is a single magnetic layer or a magnetic bilayer.

12. The spin transfer torque magnetic random access memory structure of claim 1 wherein the reference layer is disposed directly on the magnetically continuous transition layer.

13. The spin transfer torque magnetic random access memory structure of claim 1 wherein the hard layer includes an anti-parallel layer, wherein the magnetically continuous transition layer is disposed on the anti-parallel layer, and wherein the anti-parallel layer is a cobalt/platinum (Co/Pt) bilayer, a cobalt/nickel (Co/Ni) bilayer, an iron platinum (FePt) alloy, or a cobalt platinum (CoPt) alloy.

14. A spin transfer torque magnetic random access memory structure having a perpendicular magnetic orientation, comprising:
    a bottom electrode;
    a seed layer over the bottom electrode;
    an anti-parallel layer over the seed layer;
    a non-magnetic synthetic anti-ferromagnetic (SAF) coupling layer over the anti-parallel layer;
    a magnetic hard layer disposed on the non-magnetic SAF coupling layer, wherein the magnetic hard layer has a thickness of from about 6 A to about 35 A;
    a tunnel barrier layer over the magnetic hard layer;
    a storage layer formed over the tunnel barrier layer, wherein the magnetic hard layer, the tunnel barrier layer, and the storage layer form a magnetic tunnel junction (MTJ) element with a perpendicular orientation; and
    a top electrode.

15. The spin transfer torque magnetic random access memory structure of claim 14 wherein the tunnel barrier layer is disposed on the magnetic hard layer, and wherein the storage layer is disposed on the tunnel barrier layer.

16. The spin transfer torque magnetic random access memory structure of claim 14 wherein the synthetic anti-ferromagnetic non-magnetic SAF coupling layer is ruthenium or iridium.

17. The spin transfer torque magnetic random access memory structure of claim 14 wherein the magnetic hard layer is a single magnetic layer or a composite structure of magnetic and non-magnetic sublayers.

18. The spin transfer torque magnetic random access memory structure of claim 14 wherein the magnetic hard layer is a single magnetic layer or a composite structure of magnetic and non-magnetic sublayers, wherein the magnetic layer or sublayer is selected from iron (Fe), cobalt (Co), nickel (Ni), cobalt iron boride (CoFeB), iron boron (FeB) or combination of thereof, and wherein the non-magnetic sublayer is selected from molybdenum (Mo), tungsten (W), niobium (Nb), vanadium (V), zirconium (Zr), chromium (Cr), tantalum (Ta), titanium (Ti) or combination of thereof.

19. A method for fabricating an integrated circuit, the method comprising:
    forming a bottom electrode;
    forming a seed layer over the bottom electrode;
    forming an anti-parallel layer over the seed layer;
    forming a non-magnetic synthetic anti-ferromagnetic (SAF) coupling layer over the magnetic SAF layer;
    forming a magnetic layer directly on the SAF coupling layer, wherein:
        the magnetic layer is a magnetically continuous transition layer, wherein the magnetically continuous transition layer is an alloy or wherein the magnetically continuous transition layer includes a magnetic sublayer and a non-magnetic sublayer; or
        the magnetic layer is a magnetic hard layer, wherein the magnetic hard layer is a single magnetic layer or a composite structure of magnetic and non-magnetic sublayers;
    forming a tunnel barrier layer over the magnetic layer;
    forming a storage layer over the tunnel barrier layer; and
    forming a top electrode over the storage layer.

20. The method of claim 19 wherein:
    the magnetically continuous transition layer is an alloy of iron (Fe), cobalt (Co), nickel (Ni), boron (B), or combinations thereof, or wherein the magnetically continuous transition layer includes a magnetic sublayer selected from iron (Fe), cobalt (Co), nickel (Ni), cobalt iron boride (CoFeB), iron boron (FeB) or combination of thereof, and a non-magnetic sublayer selected from molybdenum (Mo), tungsten (W), niobium (Nb), vanadium (V), zirconium (Zr), chromium (Cr), tantalum (Ta), titanium (Ti) or combination of thereof; or
    wherein the magnetic hard layer is a single magnetic layer or a composite structure of magnetic and non-magnetic sublayers, wherein the magnetic layer or sublayer is selected from iron (Fe), cobalt (Co), nickel (Ni), cobalt iron boride (CoFeB), iron boron (FeB) or combination of thereof, and wherein the non-magnetic sublayer is selected from molybdenum (Mo), tungsten (W), niobium (Nb), vanadium (V), zirconium (Zr), chromium (Cr), tantalum (Ta), titanium (Ti) or combination of thereof.

* * * * *